(12) United States Patent
Chauhan et al.

(10) Patent No.: US 8,941,208 B2
(45) Date of Patent: Jan. 27, 2015

(54) RELIABLE SURFACE MOUNT INTEGRATED POWER MODULE

(75) Inventors: Shakti Singh Chauhan, Niskayuna, NY (US); Arun Virupaksha Gowda, Rexford, NY (US); Paul Alan McConnelee, Albany, NY (US)

(73) Assignee: General Electric Company, Schenectady, NY (US)

( * ) Notice: Subject to any disclaimer, the term of this patent is extended or adjusted under 35 U.S.C. 154(b) by 49 days.

(21) Appl. No.: 13/561,811

(22) Filed: Jul. 30, 2012

(65) Prior Publication Data

US 2014/0029234 A1      Jan. 30, 2014

(51) Int. Cl.
*H01L 21/70* (2006.01)

(52) U.S. Cl.
USPC ........... 257/506; 257/510; 257/758; 438/110; 438/125; 438/622

(58) Field of Classification Search
USPC ......... 257/499, 500, 501, 506, 510, 723, 724, 257/778, 758; 438/107, 108, 109, 110, 125, 438/622
See application file for complete search history.

(56) References Cited

U.S. PATENT DOCUMENTS

| | | | |
|---|---|---|---|
| 6,030,854 A | 2/2000 | Mashimoto et al. | |
| 6,104,078 A * | 8/2000 | Iida et al. | 257/524 |
| 6,306,680 B1 | 10/2001 | Fillion et al. | |
| 6,558,977 B2 | 5/2003 | Nakaoka et al. | |
| 6,710,463 B2 | 3/2004 | Choi | |
| 7,763,969 B2 * | 7/2010 | Zeng et al. | 257/700 |
| 7,999,369 B2 | 8/2011 | Malhan et al. | |
| 8,018,056 B2 | 9/2011 | Hauenstein | |
| 8,395,269 B2 * | 3/2013 | Kawano et al. | 257/778 |
| 8,409,926 B2 * | 4/2013 | Lin et al. | 438/113 |
| 2006/0128069 A1 * | 6/2006 | Hsu | 438/124 |
| 2006/0183349 A1 * | 8/2006 | Farnworth et al. | 438/792 |
| 2008/0164588 A1 | 7/2008 | Lee et al. | |
| 2012/0014069 A1 | 1/2012 | Zeng et al. | |

OTHER PUBLICATIONS

Yin, "High Temperature SiC Embedded Chip Module (ECM) with Double-Sided Metallization Structure", Virginia Polytechnic Institute and State University, Blacksburg, Virginia, Dec. 2005, pp. I-XIII and 1-159.

(Continued)

*Primary Examiner* — Sheila V Clark
(74) *Attorney, Agent, or Firm* — Ziolkowski Patent Solutions Group, SC; Jean K. Testa

(57) ABSTRACT

A surface mount packaging structure that yields improved thermo-mechanical reliability and more robust second-level package interconnections is disclosed. The surface mount packaging structure includes a sub-module having a dielectric layer, semiconductor devices attached to the dielectric layer, a first level metal interconnect structure electrically coupled to the semiconductor devices, and a second level I/O connection electrically coupled to the first level interconnect and formed on the dielectric layer on a side opposite the semiconductor devices, with the second level I/O connection configured to connect the sub-module to an external circuit. The semiconductor devices of the sub-module are attached to the first surface of a multi-layer substrate structure, with a dielectric material positioned between the dielectric layer and the multi-layer substrate structure to fill in gaps in the surface-mount structure and provide additional structural integrity thereto.

24 Claims, 6 Drawing Sheets

(56) References Cited

OTHER PUBLICATIONS

Wakharkar et al., "Materials Technologies for Themomechanical Management of Organic Packages", Intel Technology Journal, vol. 9, Issue 4, Nov. 9, 2005, pp. 309-324.

"Improved Direct Bond Copper (DBC) Substrate for High Temperature Packaging", Abstract, Virginia Tech Center for Power Electronics Systems, 2008, p. 1, www.cpes.vt.edu/public/showcase/DBC.php.

\* cited by examiner

RELIABLE SURFACE MOUNT INTEGRATED POWER MODULE

BACKGROUND OF THE INVENTION

Embodiments of the invention relate generally to structures and methods for packaging semiconductor devices and, more particularly, to a surface mount packaging structure that yields improved thermo-mechanical reliability and more robust second-level package interconnections.

Surface-mount technology is a method for constructing electronic circuits in which surface mount components or packages are mounted directly onto the surface of printed circuit boards (PCBs) or other similar external circuits. In the industry, surface-mount technology has replaced the through-hole technology construction method of fitting components with wire leads into holes in the circuit board.

One common type of component that is surface-mounted is a power semiconductor device, which is a semiconductor device used as a switch or rectifier in power electronic circuits, such as switched mode power supplies, for example. Most power semiconductor devices are only used in commutation mode (i.e., they are either on or off), and are therefore optimized for this. Many power semiconductor devices are used in high voltage power applications and are designed to carry a large amount of current and support a large voltage. In use, high voltage power semiconductor devices are surface mounted to an external circuit by way of a power overlay (POL) packaging and interconnect system, with the POL package also providing a way to remove the heat generated by the device and protect the device from the external environment.

A standard POL package manufacturing process typically begins with placement of one or more power semiconductor devices onto a dielectric layer by way of an adhesive. Metal interconnects (e.g., copper interconnects) are then electroplated onto the dielectric layer to form a direct metallic connection to the power semiconductor device(s), so as to form a POL sub-module. The metal interconnects may be in the form of a low profile (e.g., less than 200 micrometers thick), planar interconnect structure that provides for formation of an input/output (I/O) system to and from the power semiconductor device(s). The POL sub-module is then soldered to a ceramic substrate (Alumina with DBC, AlN with AMB Cu, etc.) using soldered interconnection for electrical and thermal connectivity. The gaps around the semiconductor between the POL dielectric layer and the ceramic substrate are then filled using a dielectric organic material using either capillary flow (capillary underfill), no-flow underfill or injection molding (molding compounds) to form the POL package.

In existing surface-mounted POL packages, the long term reliability of the package is limited by thermo-mechanical stresses that are generated due to the varying thermal expansion coefficients (CTEs) of the constituent materials. More specifically, the varying CTEs of the dielectric organic material/underfill and ceramic substrate of the POL package leads to thermal and bending stresses in the underfill and ceramic substrate. These thermal and bending stresses in the underfill and ceramic substrate can in turn lead to warping of the package. When warping of the package occurs, the reliability of second-level interconnections of the package is affected.

Therefore, it would be desirable to provide a surface-mount package having a stress balance-based design strategy that reduces package warpage and thermal stress, such that the package reliability in thermal cycling can be improved. It would further be desirable for such a package design strategy to improve the reliability of the second-level interconnections.

BRIEF DESCRIPTION OF THE INVENTION

Embodiments of the invention overcome the aforementioned drawbacks by providing a surface-mount package structure that yields improved thermo-mechanical reliability and more robust second-level package interconnections.

In accordance with one aspect of the invention, a surface-mount structure includes a sub-module having a dielectric layer and at least one semiconductor device attached to the dielectric layer, with each of the at least one semiconductor device including a substrate composed of a semiconductor material. The sub-module also includes a first level metal interconnect structure electrically coupled to the at least one semiconductor device that extends through vias formed through the dielectric layer so as to be connected to the at least one semiconductor device and a second level input/output (I/O) connection electrically coupled to the first level metal interconnect structure and formed on the dielectric layer on a side opposite the at least one semiconductor device, the second level I/O connection configured to connect the sub-module to an external circuit. The surface-mount structure also includes a multi-layer substrate structure having a first surface and a second surface, wherein the at least one semiconductor device of the sub-module is attached to the first surface of the multi-layer substrate. The surface-mount structure further includes one or more dielectric materials positioned between the dielectric layer and the first surface of the multi-layer substrate structure and at least partially about the at least one semiconductor device of the sub-module, the one or more dielectric materials configured to fill in gaps in the surface-mount structure and provide additional structural integrity thereto.

In accordance with another aspect of the invention, a method of manufacturing a surface-mount packaging and interconnect structure includes the step of constructing a sub-module including at least one semiconductor device and a packaging structure formed thereabout, with the step of constructing the sub-module further including attaching the at least one semiconductor device to a dielectric layer, forming a first-level metallic interconnect structure over the dielectric that extends through vias in the dielectric layer to electrically connect to the at least one semiconductor device, and forming a second level input/output (I/O) connection on the dielectric layer on a side opposite the at least one semiconductor device, with the second level I/O connection configured to connect the sub-module to an external circuit. The method also includes the step of forming a substrate structure that includes a center substrate layer and first and second metallic layers on opposing sides of the center substrate layer, such that the first and second metallic layers form a first surface and a second surface, respectively, of the substrate structure. The method further includes the steps of attaching the sub-module to the first surface of the substrate structure and providing a dielectric filler material between the dielectric layer and the first surface of the substrate structure, the dielectric filler material at least partially encapsulating the at least one semiconductor device of the sub-module.

In accordance with yet another aspect of the invention, a power overlay (POL) packaging structure includes a POL sub-module having a dielectric layer, a plurality of semiconductor devices attached to the dielectric layer, a first level interconnect structure electrically coupled to the plurality of semiconductor devices and extending through vias formed through the dielectric layer so as to be connected to the plurality of semiconductor devices, and a second level interconnect structure to electrically couple the POL sub-module to an external circuit structure, with the second level interconnect structure comprising a plurality of solder bumps formed over the dielectric layer and first level interconnect structure and configured to make an interconnection to the external circuit structure. The POL packaging structure also includes a multi-layer substrate structure having a first surface and a second surface, with the plurality of semiconductor devices of the POL sub-module being attached to the first surface of the multi-layer substrate structure. The multi-layer substrate structure of the POL packaging structure further includes a first direct bond copper (DBC) layer forming the first surface of the multi-layer substrate structure, a second DBC layer forming the second surface of the multi-layer substrate structure, and a ceramic layer sandwiched between the first and second DBC layers. The POL packaging structure further includes an encapsulate positioned between the dielectric layer and the first surface of the multi-layer substrate structure and at least partially about the plurality of semiconductor devices of the sub-module.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the present invention provide for a surface-mount package having improved thermo-mechanical reliability, as well as a method of forming such a surface-mount package.

Figure 1:
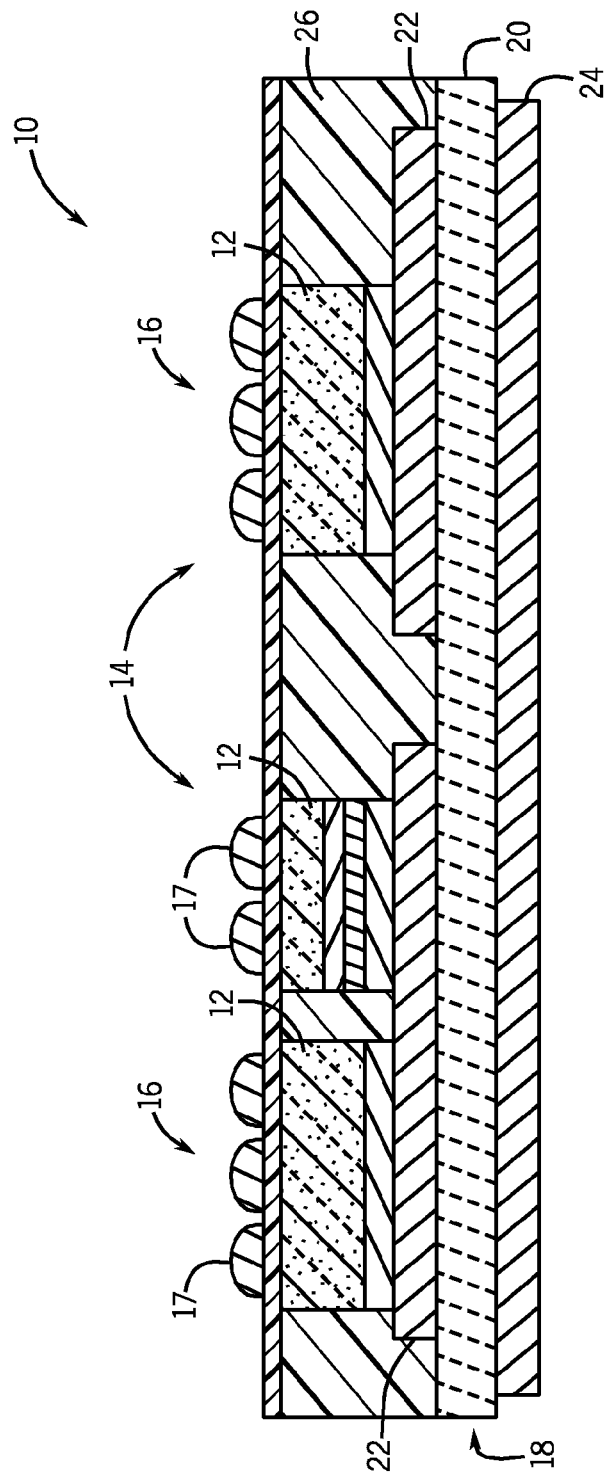
FIG. 1 is a schematic cross-sectional side view of a power overlay (POL) structure according to an embodiment of the invention.

Referring to FIG. 1, a surface-mount packaging and interconnect structure 10 is shown according to an embodiment of the invention. In the embodiment shown in FIG. 1, surface-mount package structure 10 is in the form of a power overlay (POL) structure, although it is recognized that other surface-mount package structures are considered to be within the scope of the invention. The POL structure 10 includes one or more semiconductor device(s) 12 therein that, according to various embodiments, may be in the form of a die, diode, or other power electronic device. As shown in FIG. 1, three semiconductor device(s) 12 are provided in POL structure 10, however, it is recognized that a greater or lesser number of semiconductor devices 12 could be included in POL structure 10. The semiconductor device(s) 12 are packaged within a POL sub-module 14 that forms a direct metallic connection to the power semiconductor device(s) 12, with the connection being in the form of a low profile, planar first-level interconnect structure, for example.

A second-level input-output (I/O) connection 16 is provided on POL sub-module 14 to enable surface mounting of the POL structure 10 to an external circuit, such as a printed circuit board (PCB) (not shown). According to an exemplary embodiment, the second-level I/O connection 16 is formed of land grid array (LGA) solder bumps 17 that are configured to be attached/affixed to the PCB to electrically couple the POL structure 10 to the PCB, although other suitable second-level solder interconnections, such as ball grid array (BGA) solder bumps, could also be used. The LGA solder bumps 17 provide a highly reliable interconnection structure that is resistive to failure in high stress conditions.

As shown in FIG. 1, POL structure 10 also includes a multi-layer substrate structure 18 to which POL sub-module 14 is attached. According to an exemplary embodiment, the substrate structure 18 is composed of a ceramic tile (e.g., alumina) 20 with a layer of direct bond copper (DBC) 22, 24 bonded to both sides thereof by a high-temperature joining process, with the top DBC layer 22 forming a "first surface" of the structure 18 and the bottom DBC layer 24 forming a "second surface" of the structure 18. For the joining process, different brazing and direct bond technologies may be employed based on, for example, whether tile 20 is composed of alumina or aluminum nitride and silicon nitride, etc. The top DBC layer 22, or "die side DBC layer," of substrate structure 18 is then etched after firing, to pattern the layer as desired based on the number/arrangement of semiconductor devices 12. The bottom DBC layer 24, or "non-die side DBC layer," on the backside of the substrate structure 18 is left fully or partially exposed to provide efficient heat transfer out from the POL structure 10. While referred to above and here below as "DBC layers," it is recognized that aluminum can be used instead of copper as the metal layers, and thus such an embodiment is considered within the scope of the invention. Thus, use of the term "DBC layers" here below is meant to encompass a substrate structure 18 that includes sheets of any suitable metallic material 22, 24 (such as copper or aluminum) bonded to both sides of a ceramic tile (e.g., alumina) 20. As shown in FIG. 1, a dielectric material 26 (i.e., "dielectric filler material") is also provided on POL structure 10 to fill in gaps in the POL structure 10, so as to provide additional structural integrity to POL structure 10. According to the embodiment of POL structure 10 shown in FIG. 1, the dielectric material 26 is in the form of a polymeric underfill (e.g., capillary underfill or no-flow underfill), encapsulate, silicone or molding compound. Alternatively, and as will be discussed below in greater detail with respect to FIG. 12, it is recognized that the dielectric material 26 could be formed from a combination of a ceramic or dielectric sheet and an additional dielectric filler material (underfills, molding compounds, silicone or encapsulate).

The POL structure 10 of FIG. 1 is thus formed such that the second-level package I/O connections 16 are provided on the first-level interconnect side, for second-level interconnection to a PCB or other external circuit. The specific construction of POL structure 10 yields improved thermo-mechanical reliability and more robust second-level package I/O connections 16, along with superior electrical and thermal performance.

Figure 2:
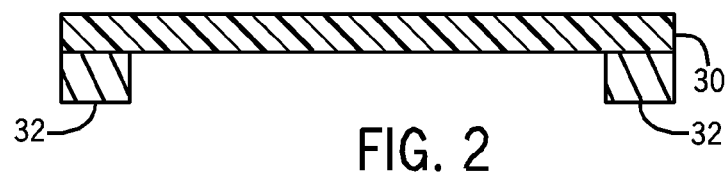
FIGS. 2-11 are schematic cross-sectional side views of a POL structure during various stages of a manufacturing/build-up process according to an embodiment of the invention.

Referring now to FIGS. 2-11, detailed views of the process steps for a technique of manufacturing the POL structure 10 of FIG. 1 are provided, according to an embodiment of the invention. As shown first in FIGS. 2-9, process steps for a build-up of the POL sub-module 14 are provided. Referring to FIG. 2, the build-up process of POL sub-module 14 begins with the placement and attachment of a dielectric layer 30 or "flex layer" onto a frame structure 32. The dielectric layer 30 is in the form of a lamination or film and is placed on frame structure 32 to provide stability during the build-up process of POL sub-module 14. According to embodiments of the invention, the dielectric layer 30 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material.

Figure 3:
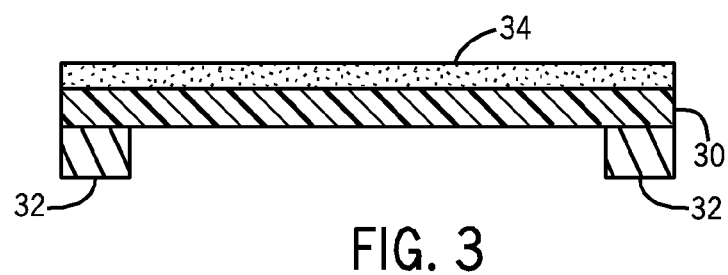
Figure 4:
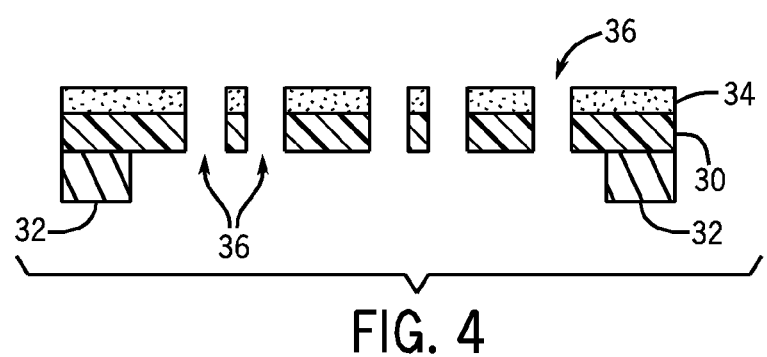
Figure 5:
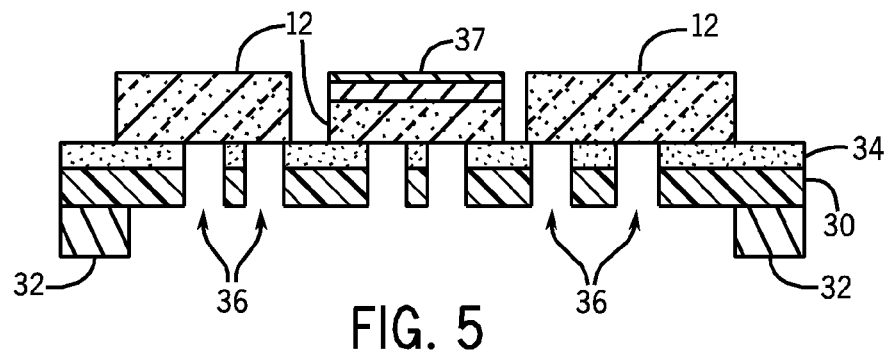

As shown in FIG. 3, upon securing of dielectric layer 30 to frame structure 32, an adhesive layer 34 is deposited onto dielectric layer 30. A plurality of vias 36 is then formed through the adhesive layer 34 and dielectric layer 30, as illustrated in FIG. 4. According to embodiments of the invention, the vias 36 may be formed by way of a laser ablation or laser drilling process, plasma etching, photo-definition, or mechanical drilling processes. In a next step of technique, one or more semiconductor devices 12 (e.g., three semiconductor devices) are secured to dielectric layer 30 by way of adhesive layer 34, as illustrated in FIG. 5. To secure the semiconductor devices 12 to dielectric layer 30, the semiconductor devices 12 are placed onto adhesive layer 34 and the adhesive 34 is then cured to secure the semiconductor device 12 on the dielectric layer 30. According to one embodiment of the invention, and as shown in FIG. 5, semiconductor devices 12 may be of varying thickness/height. In order to increase a thickness/height of a semiconductor device 12, a copper shim 37 may be soldered to one or more of semiconductor devices 12 in order to increase its thickness/height so that the thickness/height of all semiconductor devices 12 is equal and a back surface of the semiconductor devices 12 is "planarized."

While the formation of vias 36 through adhesive layer 34 and dielectric lamination 30 is shown in FIG. 4 as being performed prior to placement of semiconductor devices 12 onto adhesive layer 34, it is recognized that the placement of semiconductor devices 12 could occur prior to via formation. That is, depending on constraints imposed by via size, semiconductor devices 12 could first be placed on adhesive layer 34 and dielectric layer 30, with the vias 36 subsequently being formed at locations corresponding to a plurality of metalized circuits and/or connection pads (not shown) formed on semiconductor devices 12. Furthermore, a combination of pre- and post-drilled vias could be employed as needed.

Figure 6:
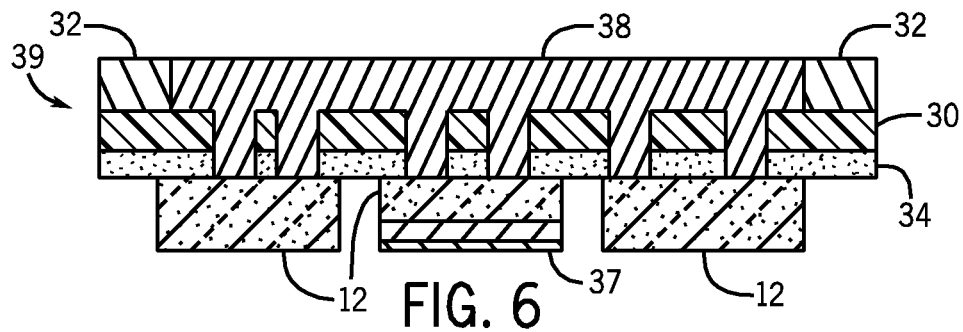
Figure 7:
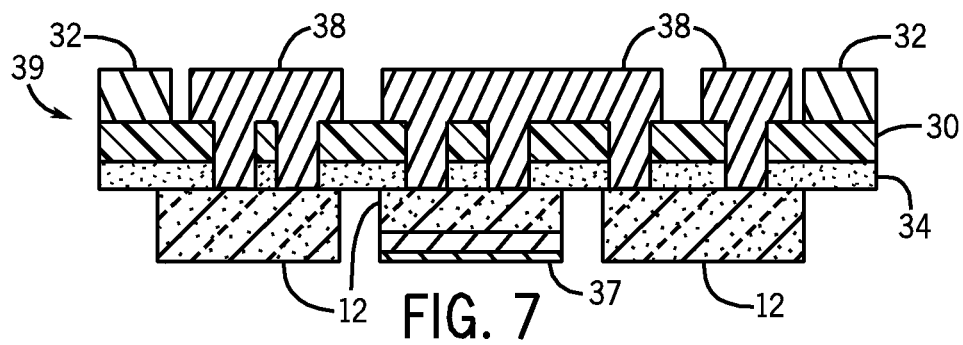

Referring now to FIGS. 6 and 7, upon securing of semiconductor devices 12 on the dielectric layer 30 and the formation of vias 36, the vias 36 are cleaned (such as through a reactive ion etching (RIE) desoot process) and subsequently metalized to form first-level interconnects 38. The first-level metal interconnects 38 are typically formed through a combination of sputtering and electroplating applications, although it is recognized that other electroless methods of metal deposition could also be used. For example, a titanium adhesion layer and copper seed layer may first be applied via a sputtering process, followed by an electroplating process that increases a thickness of the copper to a desired level. The applied metal material is then subsequently patterned into metal interconnects 38 (i.e., first level interconnects) having a desired shape and that function as vertical feed-throughs formed through dielectric layer 30 and adhesive layer 34. The metal interconnects 38 extend out from circuits and/or connection pads (not shown) of semiconductor devices 12, through vias/opening 36, and out across a top surface 39 of dielectric layer 30.

Figure 8:
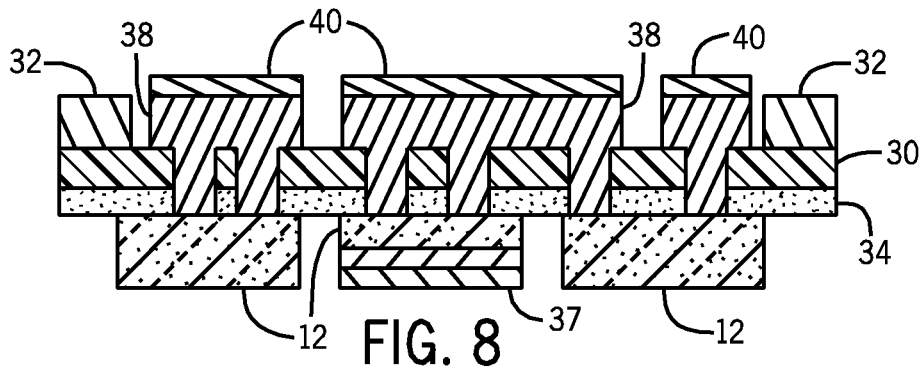

As shown in FIG. 8, a solder mask layer 40 is applied over the patterned metal interconnects 38 to provide a protective coating for the copper shims thereof. Alternative to solder, it is recognized that the layer 40 could be composed of some metal material other than solder, such as Ni or Ni/Au. As further shown in FIG. 8, the second-level I/O interconnections 16 are applied to solder mask 40, on top of the dielectric layer 30. In one embodiment, I/O interconnections 16 are formed as LGA or BGA solder bumps 17 that are soldered to solder mask 40 to enable surface mounting of the POL structure 10 to an external circuit. The solder bumps 17 provide a highly reliable second-level interconnection structure that is resistive to failure in high stress conditions.

Figure 9:
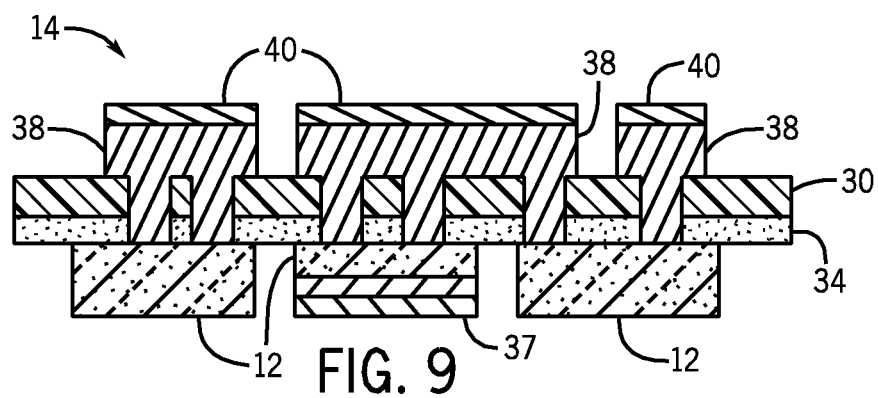

In completing the build-up of POL sub-module 14, the POL sub-module 14 is singulated and removed from frame structure 32, as illustrated in FIG. 9. A completed POL sub-module 14 is thus provided that includes semiconductor devices 12, first-level metal interconnects 38 that function as metal vertical feed-throughs, and second-level I/O interconnections 16 for surface-mounting of POL sub-module 14 to an external circuit, such as a PCB. The POL sub-module 14 is handled as a component or multi-chip module.

Figure 10:
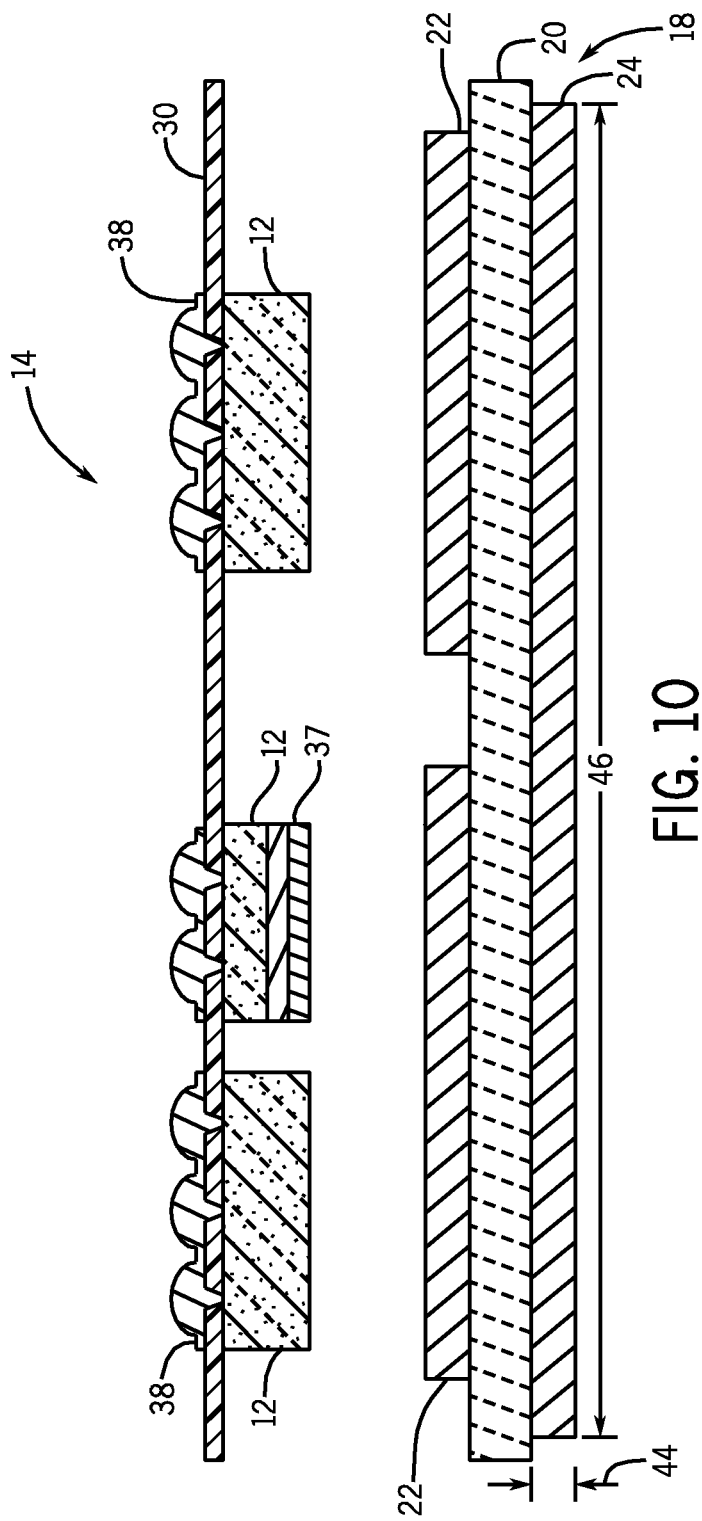

Referring now to FIG. 10, the technique of manufacturing POL structure 10 continues with the formation of a substrate structure 18 to be joined to POL sub-module 14. The substrate structure 18 is composed of a ceramic tile (e.g., alumina) 20 with die side and non-die side layers of DBC 22, 24 bonded to both sides thereof by a high-temperature joining process. As shown in FIG. 10, the die side DCB layer 22 of substrate structure 18 is patterned, such as via an etching process, to correlate to the number/arrangement of semiconductor devices 12 of POL sub-module 14. According to an exemplary embodiment, the non-die side DBC layer 24 on the backside of the substrate structure 18 is left unpatterned, as a continuous layer, so as to provide for greater bending strength of the substrate structure 18. Additionally, the entire surface of non-die side DBC layer 24 is available for thermal connection (i.e., heatsink attachment).

Figure 11:
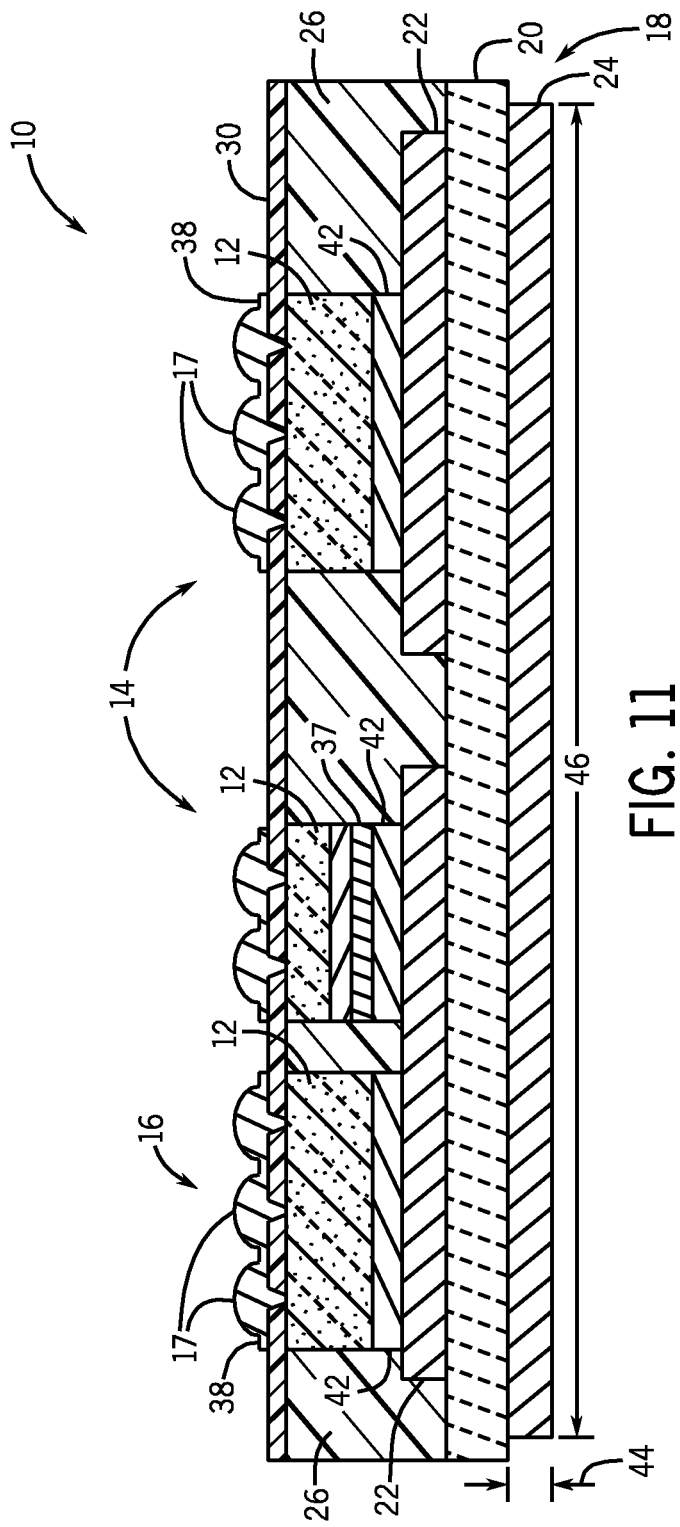

As shown in FIG. 11, the technique of manufacturing POL structure 10 continues with the attaching of POL sub-module 14 to substrate structure 18. According to one embodiment of the invention, POL sub-module 14 is attached to substrate structure 18 by way of a solder material 42, so as to secure the POL sub-module 14 and substrate structure 18 together. That is, each of semiconductor devices 12 is soldered to the die side DBC layer 22. It is recognized, however, that a conductive adhesive or sintered silver could also be used instead of a solder material to secure the POL sub-module 14 and substrate structure 18 together. A polymeric underfill, encapsulate, or molding compound 26 (e.g., epoxy or other organic filler material) is then provided on POL structure 10 that fills in gaps in the POL structure 10, as shown in FIG. 11, so as to constrain dielectric layer 30 and provide additional electrical insulation and structural integrity to the POL structure 10.

As shown in FIGS. 10 and 11, according to an exemplary embodiment of the invention, formation of the substrate structure 18 is selectively performed so as to optimize thermal performance of POL structure 10. That is, it is recognized that there is a mismatch between the coefficient of thermal expansion (CTE) of the ceramic substrate 20 (which generally has a low CTE) and the underfill 26 and copper pads/connections 22, 24, 38 (which generally have a high CTE) in the substrate structure 18, and that this CTE mismatch can lead to unbalanced thermal stresses in POL structure 10 and thereby cause module warpage, bending stress, and cracking in the ceramic/insulating substrate 20, underfill material 26, and/or the second-level I/O interconnections 16 (i.e., BGA/LGA solder bumps 17). The unbalanced thermal stresses in POL structure 10, and the warpage, bending stress and cracking caused thereby, can be minimized by selective formation of the substrate structure 18. In forming substrate structure 18, a thickness (identified as 44) and area coverage (identified as 46) of non-die side DBC layer 24 is selectively controlled so to optimize thermal performance of POL structure 10. More specifically, the ratio of a volume of non-die side DBC layer 24 to the volume of the die-side DBC layer 22 is selected/controlled such that thermal/bending stresses in the underfill 26 and ceramic substrate 20 are reduced simultaneously to within acceptable levels. By providing additional DBC volume to layer 24 on the substrate back-side (i.e., non-die side), the thermal expansion of the DBC layer 24 on the non-die side can counteract the underfill/encapsulant 26 expansion on the die side of the ceramic substrate 20, such that the thermal/bending stresses are reduced.

In determining an appropriate volume ratio/volume imbalance of the non-die side DBC 24 to the die side DBC 22, and a corresponding thickness 44 and area coverage 46 of DBC layer 24, the following factors are taken into consideration: (1) the volume of the underfill material 26 and the known material properties thereof, including the elastic modulus, coefficient of thermal expansion (CTE), and fracture stress and toughness of the underfill material; (2) the die 12 density, thickness and spacing within the POL sub-module 14; and (3) the thickness and material properties of the ceramic substrate 20, including the elastic modulus and CTE of the ceramic substrate. In general, stiffer underfill materials 26 require greater DBC volume imbalance between DBC layers 22, 24 to reduce module warpage and bending stress, whereas compliant underfill materials require lesser volume imbalance.

According to an exemplary embodiment of the invention, the DBC volume ratio/volume imbalance of the non-die side DBC 24 and the die side DBC 22 will be greater than 1 and less than 2.5, for a typical organic underfill material 26 for electronics packaging. That is, it is desired that the DBC volume ratio/volume imbalance be in this range because a balanced ceramic substrate (i.e., DBC Ratio ~1) would exhibit high unbalanced thermal stress during thermal cycling and greater package curvature (warpage) due to high CTE-mismatch between the ceramic 20 (3-9 ppm/C) and typical organic underfills 26 (9-50 ppm/C). By increasing the DBC volume ratio of the non-die side DBC 24 to between 1 and 2.5 that of the die side DBC 22, stress balance is provided that reduces POL package curvature and enables more robust second-level module interconnections 16. With respect to the above listed range of 1 to 2.5, it is recognized that the DBC volume ratio/volume imbalance of the non-die side DBC 24 and the die side DBC 22 could be less than 1 if the CTE of underfill material 26 is very low, such that the CTE mismatch is minimized.

Figure 12:
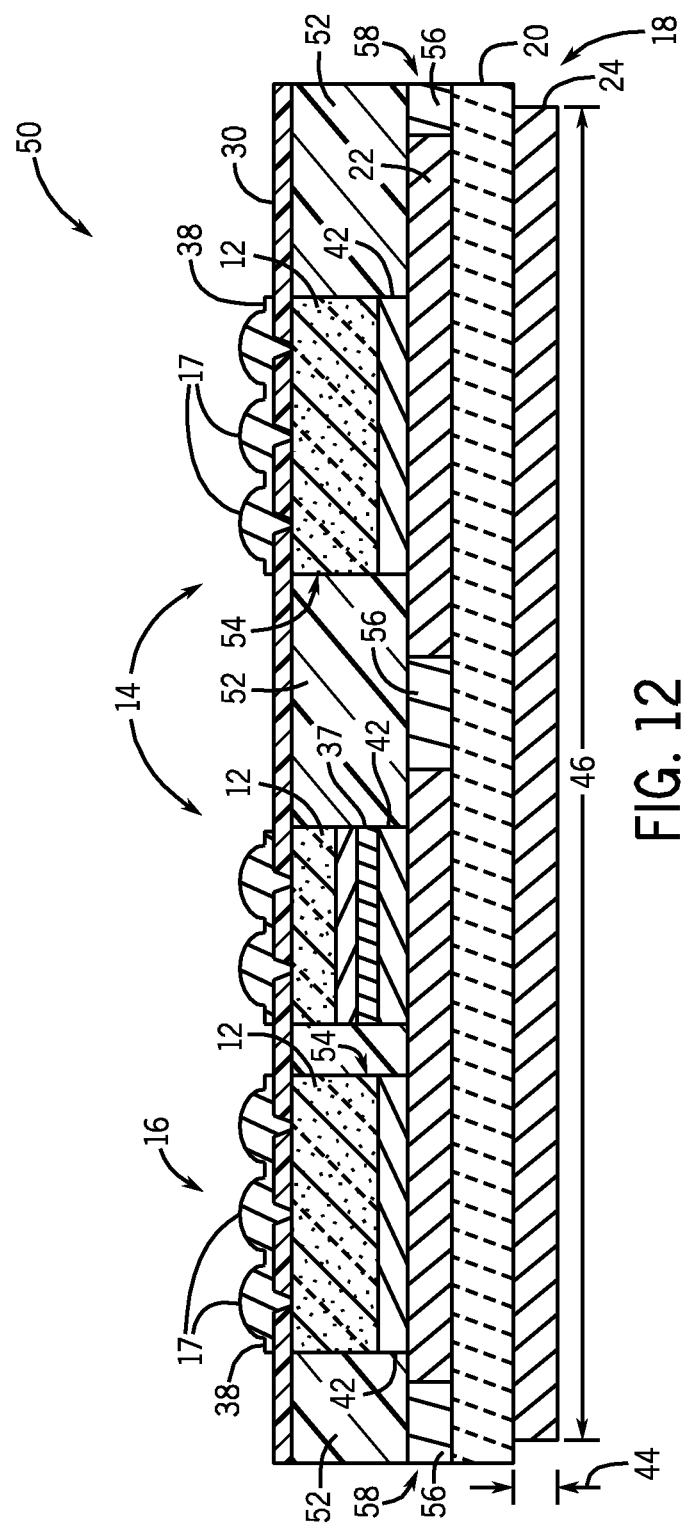
FIG. 12 is a schematic cross-sectional side view of a POL structure according to another embodiment of the invention.

Referring now to FIG. 12, a POL structure 50 is shown according to another embodiment of the invention, where separate dielectric elements are used to fills in gaps in the POL structure 50 between dielectric layer 30 and substrate structure 18 in the area occupied by dies 12. As shown in FIG. 12, a ceramic or dielectric sheet 52 is positioned between dielectric layer 30 and the multi-layer substrate structure 18, adjacent the dielectric layer 30. The ceramic/dielectric sheet 52 includes cut-outs 54 formed therein to receive the dies 12 therein. A polymeric underfill material or molding compound 56 is then positioned between the ceramic/dielectric sheet 52 and the multi-layer substrate structure 18, so as to fill-in gaps 58 between the ceramic/dielectric sheet 52 and the ceramic tile/alumina 20 of the multi-layer substrate structure 18. The implementing of ceramic/dielectric sheet 52 for filling-in a portion of the volume in the POL structure 50 between dielectric layer 30 and substrate structure 18, as opposed to entirely using only a dielectric filler material 56, beneficially makes the POL structure 50 less susceptible to moisture absorption and can further minimize thermo-mechanical stresses in the POL structure 50 so as to reduce cracking, delaminations, etc.

With respect to POL structure 50, it is recognized that the volume and the known thermo-mechanical material properties of each of the ceramic/dielectric sheet 52 and the underfill material 56 are taken into account in determining an appropriate volume ratio/volume imbalance of the non-die side DBC 24 to the die side DBC 22, and a corresponding thickness 44 and area coverage 46 of DBC layer 24. The elastic modulus, coefficient of thermal expansion (CTE), and fracture stress and toughness of each of the ceramic/dielectric sheet 52 and the underfill material 56 may differ from one another, and thus these material properties for each separate element are considered when determined the volume ratio/volume imbalance.

Beneficially, embodiments of the invention thus provide a POL packaging and interconnect structure 10 having second-level package I/O's 16 that are provided on the flex side (i.e., on top of dielectric layer 30) of the POL sub-module 14 for second-level interconnection to an external circuit and the entire non-die side DBC layer 24 is available for thermal connection. The POL structure 10 incorporates a stress balance-based design strategy that reduces package warpage and thermal stress, such that the package reliability in thermal cycling can be improved. Thermal expansion of the non-die side DBC layer 24 counteracts the underfill/encapsulant expansion on the die side of the ceramic substrate 20, with the resulting stress balance reducing package curvature and enabling more robust second-level module interconnections 16. A non-die side DBC layer 24 can be formed to provide optimal DBC volume ratio/volume imbalance for a given package design (device size, density etc.), with the volume determination of the non-die side DBC layer 24 being based on the package curvature requirement for second level assembly, along with the dielectric material and insulating material's bending strength and toughness.

Therefore, according to one embodiment of the invention, a surface-mount structure includes a sub-module having a dielectric layer and at least one semiconductor device attached to the dielectric layer, with each of the at least one semiconductor device including a substrate composed of a semiconductor material. The sub-module also includes a first level metal interconnect structure electrically coupled to the at least one semiconductor device that extends through vias formed through the dielectric layer so as to be connected to the at least one semiconductor device and a second level input/output (I/O) connection electrically coupled to the first level metal interconnect structure and formed on the dielectric layer on a side opposite the at least one semiconductor device, the second level I/O connection configured to connect the sub-module to an external circuit. The surface-mount structure also includes a multi-layer substrate structure having a first surface and a second surface, wherein the at least one semiconductor device of the sub-module is attached to the first surface of the multi-layer substrate. The surface-mount structure further includes one or more dielectric materials positioned between the dielectric layer and the first surface of the multi-layer substrate structure and at least partially about the at least one semiconductor device of the sub-module, the one or more dielectric materials configured to fill in gaps in the surface-mount structure and provide additional structural integrity thereto.

According to another embodiment of the invention, a method of manufacturing a surface-mount packaging and interconnect structure includes the step of constructing a sub-module including at least one semiconductor device and a packaging structure formed thereabout, with the step of constructing the sub-module further including attaching the at least one semiconductor device to a dielectric layer, forming a first-level metallic interconnect structure over the dielectric that extends through vias in the dielectric layer to electrically connect to the at least one semiconductor device, and forming a second level input/output (I/O) connection on the dielectric layer on a side opposite the at least one semiconductor device, with the second level I/O connection configured to connect the sub-module to an external circuit. The method also includes the step of forming a substrate structure that includes a center substrate layer and first and second metallic layers on opposing sides of the center substrate layer, such that the first and second metallic layers form a first surface and a second surface, respectively, of the substrate structure. The method further includes the steps of attaching the sub-module to the first surface of the substrate structure and providing a dielectric filler material between the dielectric layer and the first surface of the substrate structure, the dielectric filler material at least partially encapsulating the at least one semiconductor device of the sub-module.

According to yet another embodiment of the invention, a power overlay (POL) packaging structure includes a POL sub-module having a dielectric layer, a plurality of semiconductor devices attached to the dielectric layer, a first level interconnect structure electrically coupled to the plurality of semiconductor devices and extending through vias formed through the dielectric layer so as to be connected to the plurality of semiconductor devices, and a second level interconnect structure to electrically couple the POL sub-module to an external circuit structure, with the second level interconnect structure comprising a plurality of solder bumps formed over the dielectric layer and first level interconnect structure and configured to make an interconnection to the external circuit structure. The POL packaging structure also includes a multi-layer substrate structure having a first surface and a second surface, with the plurality of semiconductor devices of the POL sub-module being attached to the first surface of the multi-layer substrate structure. The multi-layer substrate structure of the POL packaging structure further includes a first direct bond copper (DBC) layer forming the first surface of the multi-layer substrate structure, a second DBC layer forming the second surface of the multi-layer substrate structure, and a ceramic layer sandwiched between the first and second DBC layers. The POL packaging structure further includes an encapsulate positioned between the dielectric layer and the first surface of the multi-layer substrate structure and at least partially about the plurality of semiconductor devices of the sub-module.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A surface-mount structure comprising:
    a sub-module, the sub-module comprising:
        a dielectric layer;
        at least one semiconductor device attached to the dielectric layer, with each of the at least one semiconductor device including a substrate composed of a semiconductor material;
        a first level metal interconnect structure electrically coupled to the at least one semiconductor device, the metal interconnect structure extending through vias formed through the dielectric layer so as to be connected to the at least one semiconductor device; and
        a second level input/output (I/O) connection electrically coupled to the first level metal interconnect structure and formed on the dielectric layer on a side opposite the at least one semiconductor device, the second level I/O connection configured to connect the sub-module to an external circuit;
    a multi-layer substrate structure having a first surface and a second surface, wherein the at least one semiconductor device of the sub-module is attached to the first surface of the multi-layer substrate; and
    one or more dielectric materials positioned between the dielectric layer and the first surface of the multi-layer substrate structure and at least partially about the at least one semiconductor device of the sub-module, the one or more dielectric materials configured to fill in gaps in the surface-mount structure and provide additional structural integrity thereto.

2. The surface-mount structure of claim 1 wherein the multi-layer substrate structure comprises:
    a ceramic insulating layer;
    a first metallic layer positioned on one side of the insulating layer to form the first surface of the multi-layer substrate structure; and
    a second metallic layer positioned on another side of the insulating layer to form the second surface of the multi-layer substrate structure.

3. The surface-mount structure of claim 2 wherein the first and second metallic layers comprise first and second direct bond copper (DBC) layers.

4. The surface-mount structure of claim 3 wherein the first DBC layer comprises a patterned DBC layer and the second DBC layer comprises a patterned or unpatterned DBC layer.

5. The surface-mount structure of claim 3 wherein a volume of the second DBC layer is greater than a volume of the first DBC layer.

6. The surface-mount structure of claim 5 wherein the volume of the second DBC layer is between 1 and 2.5 times the volume of the first DBC layer.

7. The surface-mount structure of claim 5 wherein a thickness or area of the second DBC layer, and the corresponding volume, is controlled based on at least one of a thickness and material properties of the one or more dielectric materials, a density, thickness, and spacing of the at least one semiconductor device, and a thickness and material properties of the ceramic insulating layer.

8. The surface-mount structure of claim 7 wherein the material properties of the one or more dielectric materials and the ceramic insulating layer include at least one of an elastic modulus, coefficient of thermal expansion (CTE), and fracture stress and toughness.

9. The surface-mount structure of claim 1 wherein the one or more dielectric materials comprises an underfill material, encapsulant, silicone or molding compound positioned between the dielectric layer and the first surface of the multi-layer substrate structure.

10. The surface-mount structure of claim 1 wherein one or more dielectric materials comprises:
    a ceramic or dielectric sheet positioned between the dielectric layer and the first surface of the multi-layer substrate structure, the ceramic or dielectric sheet having cut-outs formed therein to receive the at least one semiconductor device; and a dielectric filler material positioned between the ceramic or dielectric sheet and the first surface of the multi-layer substrate structure so as to fill-in gaps between the ceramic or dielectric sheet and the multi-layer substrate structure.

11. The surface-mount structure of claim 1 wherein the second level I/O connection comprises one of land grid array (LGA) solder bumps and ball grid array (BGA) solder bumps.

12. The surface-mount structure of claim 11 further comprising one of a solder material, a conductive adhesive, or sintered metal joint positioned between the multi-layer substrate structure and the sub-module to secure the sub-module to the multi-layer substrate structure.

13. The surface-mount structure of claim 1 wherein the sub-module comprises a power overlay (POL) sub-module.

14. A method of manufacturing a surface-mount packaging and interconnect structure comprising:
   constructing a sub-module including at least one semiconductor device and a packaging structure formed thereabout, wherein constructing the sub-module comprises:
      attaching the at least one semiconductor device to a dielectric layer;
      forming a first-level metallic interconnect structure over the dielectric layer, the first-level metallic interconnect structure extending through vias in the dielectric layer to electrically connect to the at least one semiconductor device; and
      forming a second level input/output (I/O) connection on the dielectric layer on a side opposite the at least one semiconductor device, the second level I/O connection configured to connect the sub-module to an external circuit;
   forming a substrate structure that includes a center substrate layer and first and second metallic layers on opposing sides of the center substrate layer, such that the first and second metallic layers form a first surface and a second surface, respectively, of the substrate structure;
   attaching the sub-module to the first surface of the substrate structure; and
   providing a dielectric filler material between the dielectric layer and the first surface of the substrate structure, the dielectric filler material being provided at least partially about the at least one semiconductor device of the sub-module.

15. The method of claim 14 wherein forming the substrate structure further comprises:
   determining a desired volume ratio of the second metallic layer to the first metallic layer; and
   forming the second metallic layer to have a thickness and area that provides the desired volume ratio of the second metallic layer to the first metallic layer.

16. The method of claim 15 wherein determining the desired volume ratio of the second metallic layer to the first metallic layer is based on at least one of a thickness and material properties of the dielectric filler material; a density, thickness, and spacing of the at least one semiconductor device; and a thickness and material properties of the center substrate layer.

17. The method of claim 16 wherein the material properties of the dielectric filler material and the center substrate layer include at least one of an elastic modulus, coefficient of thermal expansion (CTE), and fracture stress and toughness.

18. The method of claim 15 wherein the desired volume ratio of the second metallic layer to the first metallic layer is between 1 and 2.5.

19. The method of claim 15 wherein the desired volume ratio of the second metallic layer to the first metallic layer provides a stress balanced surface-mount packaging and interconnect structure that minimizes warpage and thermal stresses therein.

20. The method of claim 14 wherein providing the dielectric filler material comprises:
   providing a ceramic or dielectric sheet positioned between the dielectric layer and the first surface of the substrate structure, the ceramic or dielectric sheet having cut-outs formed therein to receive the at least one semiconductor device; and
   providing an underfill material or molding compound positioned between the ceramic or dielectric sheet and the first surface of the substrate structure so as to fill-in gaps between the ceramic or dielectric sheet and the substrate structure.

21. A power overlay (POL) packaging structure comprising:
   a POL sub-module, the POL sub-module comprising:
      a dielectric layer;
      a plurality of semiconductor devices attached to the dielectric layer;
      a first level interconnect structure electrically coupled to the plurality of semiconductor devices, the first level interconnect structure extending through vias formed through the dielectric layer so as to be connected to the plurality of semiconductor devices; and
      a second level interconnect structure to electrically couple the POL sub-module to an external circuit structure, the second level interconnect structure comprising a plurality of solder bumps formed over the dielectric layer and first level interconnect structure and configured to make an interconnection to the external circuit structure;
   a multi-layer substrate structure having a first surface and a second surface, wherein the plurality of semiconductor devices of the POL sub-module is attached to the first surface of the multi-layer substrate structure, and wherein the multi-layer substrate structure includes:
      a first direct bond copper (DBC) layer forming the first surface of the multi-layer substrate structure;
      a second DBC layer forming the second surface of the multi-layer substrate structure; and
      a ceramic layer sandwiched between the first and second DBC layers; and
   a dielectric filler material positioned between the dielectric layer and the first surface of the multi-layer substrate structure and at least partially about the plurality of semiconductor devices of the sub-module.

22. The POL packaging structure of claim 21 wherein there is a volume imbalance between the first DBC layer and the second DBC layer, with the second DBC layer having a greater volume than the first DBC layer; and
   wherein the volume of the second DBC layer is determined based on at least one of a thickness and material properties of the dielectric filler material, a density, thickness, and spacing of the plurality of semiconductor devices, and a thickness and material properties of the ceramic layer, with the material properties of the dielectric filler material and the ceramic layer comprising at least one of an elastic modulus, coefficient of thermal expansion (CTE), and fracture stress and toughness.

23. The POL packaging structure of claim 22 wherein the volume imbalance between the first DBC layer and the second DBC layer is between 1 and 2.5.

24. The POL packaging structure of claim 21 wherein the dielectric filler material comprises an underfill material, encapsulate, silicone or a molding compound, or a combination of a ceramic or dielectric sheet and a dielectric filler material.

* * * * *